US009606165B2

United States Patent
Chatroux et al.

(10) Patent No.: US 9,606,165 B2
(45) Date of Patent: Mar. 28, 2017

(54) DEVICE FOR DETECTING A DEFECT IN INSULATION

(71) Applicant: Commissariat a l'energie atomique et aux energies alternatives, Paris (FR)

(72) Inventors: Daniel Chatroux, Teche (FR); Sebastien Carcouet, Vif (FR); Julien Dauchy, Moirans (FR)

(73) Assignee: Commissariat A L'Energie Atomique Et Aux Energies Alternatives, Paris (FR)

( * ) Notice: Subject to any disclaimer, the term of this patent is extended or adjusted under 35 U.S.C. 154(b) by 594 days.

(21) Appl. No.: 14/090,473

(22) Filed: Nov. 26, 2013

(65) Prior Publication Data

US 2014/0084935 A1    Mar. 27, 2014

Related U.S. Application Data

(63) Continuation of application No. PCT/EP2012/060396, filed on Jun. 1, 2012.

(51) Int. Cl.
*G01R 31/14* (2006.01)
*G01R 27/18* (2006.01)
(Continued)

(52) U.S. Cl.
CPC ............ *G01R 31/14* (2013.01); *B60L 3/0046* (2013.01); *B60L 3/0069* (2013.01); *B60L 3/04* (2013.01);
(Continued)

(58) Field of Classification Search
CPC .. G01R 31/1272; G01R 27/18; G01R 31/025; B60L 11/1803; Y02T 10/7005
(Continued)

(56) References Cited

U.S. PATENT DOCUMENTS 6,992,490 B2 *  1/2006  Nomoto ............... B60L 3/0023
                                                  324/509
RE44,455 E      8/2013  Mueller
(Continued)

FOREIGN PATENT DOCUMENTS

EP    1857825    11/2007
EP    2105753     9/2009
(Continued)

*Primary Examiner* — Billy Lactaoen
(74) *Attorney, Agent, or Firm* — Occhiuti & Rohlicek LLP

(57) ABSTRACT

An electrical power supply includes DC source outputting Vm and a device that detects insulation defects in the DC source. The device includes input terminals connected to the source's terminals, impedances Z1 and Z2 connected in series between the input terminals, where Z1=Z2=Z and Vm/Imax<z<(3/2)*Vm/Imax, wherein Imax is a maximum insulation defect current defined by a standardized safety threshold, and a current-detection circuit connected between ground and an intermediate point between the impedances. The current-detection circuit includes a microcontroller that receives a voltage proportional to the defect current originating from the intermediate point, the input terminal being connected by Z3 to a power supply with Vcc<Vm, the input terminal being connected to ground by way of Z4. The microcontroller is configured to determine amplitude of an insulation defect as a function of the voltage applied to the input terminal, wherein Z*Vcc/(4*Vm)<(Z3,Z4) <Ztmax=Z*Vcc/2Vm.

14 Claims, 3 Drawing Sheets

(51) Int. Cl.
    *G01R 31/02*     (2006.01)
    *B60L 3/00*     (2006.01)
    *B60L 3/04*     (2006.01)
    *B60L 11/18*     (2006.01)

(52) U.S. Cl.
    CPC ....... *B60L 11/1803* (2013.01); *B60L 11/1864* (2013.01); *G01R 27/18* (2013.01); *G01R 31/025* (2013.01); *B60L 2240/547* (2013.01); *B60L 2250/10* (2013.01); *B60L 2270/145* (2013.01); *Y02T 10/7005* (2013.01); *Y02T 10/7011* (2013.01); *Y02T 10/7061* (2013.01)

(58) Field of Classification Search
    USPC ........................................................ 324/503
    See application file for complete search history.

(56) References Cited

U.S. PATENT DOCUMENTS

| | | | |
|---|---|---|---|
| 2003/0234653 | A1 | 12/2003 | Kollenda et al. |
| 2004/0212371 | A1 | 10/2004 | Nomoto et al. |
| 2007/0285057 | A1 | 12/2007 | Yano |
| 2008/0158756 | A1* | 7/2008 | Lindsey ................ B60L 3/0023 361/88 |

FOREIGN PATENT DOCUMENTS

| | | |
|---|---|---|
| EP | 2333568 | 6/2011 |
| FR | 2671190 | 7/1992 |
| FR | 2721407 | 12/1995 |
| GB | 2317278 | 3/1998 |
| JP | 8163704 | 6/1996 |
| WO | WO2008/088448 | 7/2008 |
| WO | WO2009/043772 | 4/2009 |

\* cited by examiner

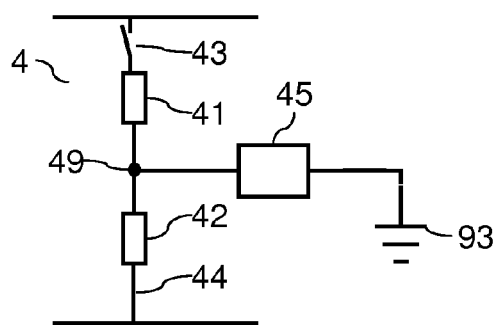
Fig. 3
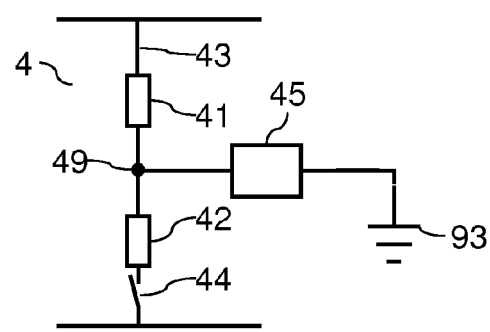
Fig. 4
Fig. 5
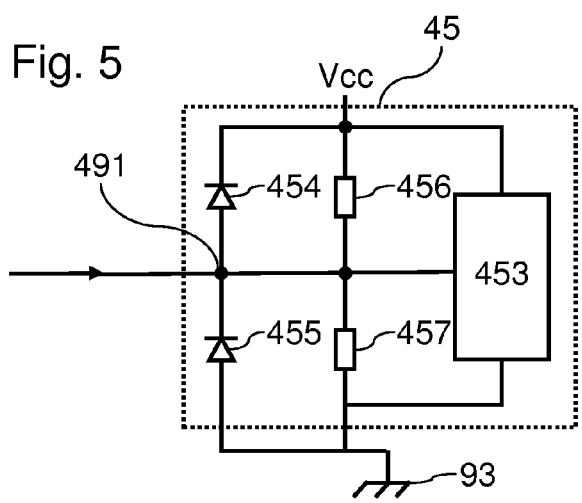

DEVICE FOR DETECTING A DEFECT IN INSULATION

CROSS-REFERENCE TO RELATED APPLICATIONS

Under 35 USC 120, this application is a continuation of and claims the benefit of the priority date of PCT/EP2012/060396, filed on Jun. 1, 2012, which claims the priority of French Application 1154851, filed on Jun. 1, 2011. The contents of which are herein incorporated by reference.

FIELD OF INVENTION

The invention relates to the insulation of a DC voltage electrical power supply or a network with respect to ground.

BACKGROUND

High-power DC voltage electrical systems are undergoing significant development. Indeed, numerous transport systems include a DC voltage supply.

Hybrid combustion/electric or electric vehicles include, in particular, high-power batteries. To obtain the appropriate voltage level, several electrochemical accumulators are placed in series. To obtain high powers and capacities, several groups of accumulators are placed in series. The number of stages (number of groups of accumulators) and the number of accumulators in parallel in each stage vary as a function of the desired voltage, current and capacity of the battery. The association of several accumulators is called a battery of accumulators. The electrochemical accumulators used for such vehicles are generally of the lithium ion type for their capacity to store significant energy with a confined weight and volume. Battery technologies of Lithium-ion iron phosphate LiFePO4 type form the subject of significant developments on account of a high intrinsic safety level, to the detriment of a somewhat restrained energy storage density.

Such batteries are used to propel an AC electric motor by way of an inverter. The voltage levels necessary for such motors reach several hundreds of Volts, typically of the order of 400 Volts. Such batteries also comprise a high capacity so as to favor the autonomy of the vehicle in electric mode. Several technical reasons specific to the automobile application lead to the use of insulation between the vehicle's mechanical mass (formed by the vehicle's metal chassis and metal bodyshell, and therefore accessible to the user) and the potentials of the battery. The main reason is that it is not conceivable upon a first insulation defect while driving to instantaneously disconnect the traction battery. For example, in the case where one of the poles of the battery is linked to the mechanics while the insulation defect appears on the other pole, This is manifested by a short-circuit and the immediate fusing of the protection fuse. This would have the effect of rendering the vehicle dangerous. On account of the disappearance of traction power or of recuperative braking, this therefore makes it obligatory to insulate the battery and to check this insulation for reasons of personal safety with an insulation monitor. Indeed, if upon a first defect there is no risk for the user, it is appropriate to alert him of this first defect before the appearance of a second defect having the effect of disconnecting the traction battery since this causes a short-circuit between the positive and negative terminals of the battery. Moreover, upon this second defect, the voltage of the battery would be directly linked to the vehicle's mechanical mass and the user would therefore be potentially in contact with the latter. On account of the potential risk of such an energy source for users, the insulation and the monitoring of the insulation between the battery and the mechanical mass must be particularly meticulous. Any conducting part of the vehicle must be insulated with respect to the masses. This insulation is effected through the use of insulating materials. The insulation may deteriorate with time (because of vibrations, mechanical knocks, dust, etc.), and therefore connect the mechanical mass to a dangerous potential.

Moreover, it is conceivable to use a charger that is not galvanically insulated from the electrical network. The mechanical mass of the vehicle being normatively grounded during recharges and the neutral regime used conventionally (EE regime) residentially connecting the neutral to the ground, this amounts to connecting the mechanical mass of the vehicle to one of the potentials of the battery during recharges. During these recharges, the complete voltage of the battery is therefore applied across the terminals of the insulation in contradistinction to the nominal case where only half this voltage is applied and above all monitored. This insulation might not be capable of coping with the complete voltage creating a second defect instantaneously resulting in a short-circuit.

An electric vehicle according to the prior art typically exhibits a battery intended for the power supply of a three-phase electric motor. The battery comprises electrochemical accumulators. A protection device furnished with fuses is connected to the terminals of the battery. An insulation-monitoring device is also connected to the terminals of the battery and linked up to the mechanical mass of the vehicle. The insulation-monitoring device is connected to a computer to signal the insulation defects detected to it. This computer is powered by an onboard network battery. The terminals of the battery apply voltages +Vbat and −Vbat to the DC inputs of an inverter by way of a cutoff system. The cutoff system comprises power contactors controlled by the computer. The electric motor is connected to the AC output of the inverter. Various types of insulation monitoring are known from the prior art.

Document FR2671190 describes, in particular, a device for monitoring insulation of a DC voltage electrical network. This document describes a resistive bridge injecting an AC component (about 30 V) at low frequency (between 4 and 10 Hz). A detection circuit measures a current passing through an insulation impedance and a measurement resistor down to the ground. The design of such a circuit involves a compromise in the rating of the resistors of the resistive bridge.

The resistive bridge induces an electrical consumption that remains relatively significant so as to retain appropriate measurement precision. Such current consumption may turn out to be incompatible with an application in onboard systems, for example on account of the decrease in autonomy of an electric vehicle. Moreover, such a device is relatively expensive on account of the use of a low-frequency generator rated for a high DC voltage. Furthermore, the detection circuit allows only the detection of an insulation defect between one of the terminals and ground, but not the detection of an insulation defect between the other terminal and ground. Moreover, such a monitoring device is sensitive to false positives since it detects an insulation defect when AC currents pass through common-mode capacitors present in the inverter.

In another solution usually implemented in an electric vehicle 1, the insulation-monitoring device comprises a resistive voltage divider. A microcontroller is connected between the midpoint of the voltage divider and the mechanical mass. The resistors of the voltage divider on either side of the midpoint are identical. Thus, in the absence of insulation defect, the voltage on the input of the microcontroller is zero and no insulation defect is signaled. Upon the appearance of an insulation defect between one of the terminals of the battery and the mechanical mass, the potential of the midpoint of the voltage divider is shifted. A voltage then appears on the input of the microcontroller, thereby generating an insulation-defect signal.

A processing circuit is connected between the midpoint and the input of the microcontroller. This processing circuit comprises a measurement resistor connected between a potential −Vcc generated on the basis of the onboard network battery of the vehicle. A first operational amplifier in inverter mode exhibits a double power supply with a potential at −Vcc and a potential at +Vcc. The non-inverting input of this first amplifier is connected to −Vcc. The inverting input of this first amplifier is connected to the midpoint by way of a second resistor and of an adder circuit that increases the potential on the inverting input of a quantity Vcc/2. A second operational amplifier in inverter mode exhibits a double power supply with a potential at −Vcc and a potential at +Vcc. The non-inverting input of this second amplifier is connected to −Vcc. The inverting input of this second amplifier is connected to the output of the first operational amplifier by way of a third resistor. The output of the second operational amplifier is connected to the input of the microcontroller.

This solution turns out to be relatively expensive and requires numerous hardware components. Moreover, to ensure a sufficient detection capacity for various charge levels of the batteries, the resistors present in the voltage divider must exhibit a relatively restricted value, on the order of 50 kΩ. These resistors then induce a relatively significant DC electrical consumption to the detriment of the autonomy provided by the battery. The processing circuit also induces non-negligible electrical consumption. It also requires a power supply that is at one and the same time negative and positive, thereby adding cost and complexity. Moreover, the necessary negative power supply is used only for this function. Furthermore, it is desirable to be able to ensure, at one and the same time, protection of the user against a touch current and sufficient precision of the quantification of the insulation defect.

SUMMARY

The invention is aimed at solving one or more of these drawbacks. The invention thus pertains to an electrical power supply device comprising: a DC voltage source liable to induce electrocution, applying a nominal voltage VM between its terminals; a device for detecting an insulation defect of the DC voltage source, comprising: first and second input terminals connected to the terminals of the voltage source; first and second impedances connected in series between the first and second input terminals, the first and second impedances each exhibiting an impedance value Z of between Zmin and Zmax, with Zmin=VM/Imax and Zmax=1.5*Vm/Imax, Imax being a maximum insulation defect current defined by a standardized safety threshold; and a current-detection circuit connected between an electrical ground and an intermediate point between the first and second impedances.

The current-detection circuit comprises a microcontroller comprising an input terminal receiving a voltage proportional to the insulation defect current originating from the intermediate point, the input terminal being connected by way of a third impedance to a power supply with a voltage level Vcc at least ten times lower than the voltage level of the DC voltage source, the input terminal being, moreover, connected to the electrical ground by way of a fourth impedance, the microcontroller being configured to determine the amplitude of an insulation defect as a function of the voltage applied to its input terminal, the third and fourth impedances each exhibiting an impedance value Zt of between Ztmin and Ztmax, with Ztmin=Z*Vcc/ and Ztmax=Z*Vcc/2 Vm.

According to one embodiment, the first and second impedances are rated so as to be traversed by a maximum current of less than 3.5 mA when one of the terminals of the battery is short-circuited to the electrical ground.

In a further embodiment, the device comprises: a third breaker connected in series with the first impedance between the first input terminal and the intermediate point; a fourth breaker connected in series with the second impedance between the second input terminal and the intermediate point; and a control circuit configured to simultaneously keep one of the third and fourth breakers open and the other of the third and fourth breakers closed.

In another embodiment, the device comprises a first diode connected in parallel with the third impedance and a second diode connected in parallel with the fourth impedance.

In yet another embodiment, the third and fourth impedances are substantially identical resistors.

In another embodiment, the device comprises: a fifth impedance connected in parallel with the third impedance and exhibiting a lower impedance value than the third impedance; a sixth impedance connected in parallel with the fourth impedance and exhibiting a lower impedance value than the fourth impedance; a first breaker connected in series with the fifth impedance; and a second breaker connected in series with the sixth impedance.

In another embodiment, the device comprises a control circuit configured to transiently and simultaneously close the first and second breakers.

In yet another embodiment, the control circuit is configured to determine that the amplitude of the insulation defect exceeds a threshold and configured to transiently close the first and second breakers when a crossing of the threshold is determined.

In yet another embodiment, the microcontroller generates a signal proportional to the voltage of the intermediate point and provides the control circuit with the signal generated.

In a further embodiment, the voltage level of the power supply is less than 25 V.

In yet another embodiment, the first and second impedances exhibit an impedance value of greater than or equal to 100 kΩ.

In a further embodiment, the first and second impedances are substantially identical resistors.

In another aspect, the invention features a motorization system that includes an electrical power supply device such as described hereinabove, in which the DC voltage source is a battery; an inverter exhibiting a DC interface and an AC interface, the terminals of the battery being connected to the DC interface; and an electric motor connected to the AC interface of the inverter.

In one embodiment, the voltage across the terminals of the battery is greater than 100 V.

DESCRIPTION OF THE FIGURES

Other characteristics and advantages of the invention will emerge clearly from the description thereof given hereinafter, by way of wholly non-limiting indication, with reference to the appended drawings, in which:

FIGS. 3 and 4 illustrate the configurations of the insulation defect detection device during two monitoring phases;

FIG. 5 is a schematic representation of a circuit for quantifying the leakage current of a first embodiment.

DETAILED DESCRIPTION

The invention proposes an electrical power supply device including a DC voltage source liable to induce electrocution and applying a nominal voltage Vm between its terminals. An insulation-defect detection device comprises first and second input terminals connected to the terminals of the voltage source. First and second impedances are connected in series between the input terminals. A current-detection circuit is connected between an electrical ground and an intermediate point between the first and second impedances. These first and second impedances each exhibit an impedance value Z of between Zmin and Zmax, with Zmin=VM/Imax and Zmax=1.5*Vm/Imax, Imax being a maximum insulation-defect current defined by a standardized safety threshold. The current-detection circuit comprises a microcontroller whose input terminal receives a voltage Vcc proportional to the insulation defect current originating from the intermediate point. The input terminal is connected to the intermediate point of two impedances, which link it up respectively to the ground and to a power supply. These two impedances each exhibit an impedance value Zt of between Ztmin and Ztmax, with Ztmin=Z*Vcc/4 Vm and Ztmax=Z*Vcc/2 Vm. The level of the power supply is at least ten times lower than the voltage level of the DC voltage source.

The invention makes it possible to carry out the leakage current measurement with a minimum of hardware components, with hardware components of restricted cost and with a single power supply of the measurement circuit. The invention furthermore makes it possible to ensure the protection of people against a touch current, while benefiting from precise quantification of the insulation defect current.

Figure 1:
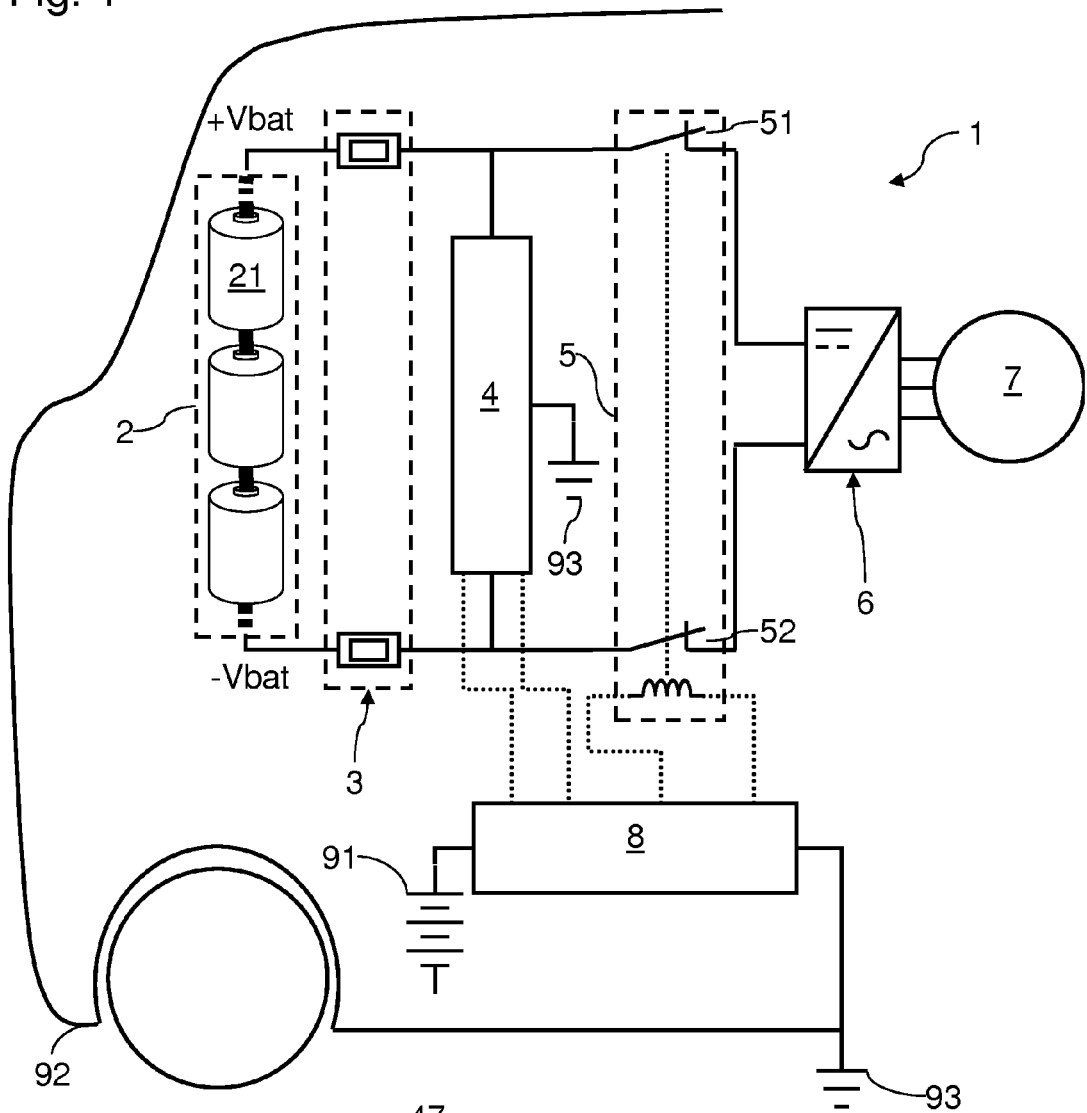
FIG. 1 is a schematic representation of an exemplary vehicle with electric motor powered by battery.

FIG. 1 illustrates an exemplary vehicle 1 implementing an embodiment of the invention. The vehicle 1 is an electric vehicle comprising a battery 2 including electrochemical accumulators 21 connected in series. The battery 2 comprises a large number of accumulators 21 connected in series, typically between 40 and 150 accumulators, depending on the voltage required and the type of accumulators used. The voltage across the terminals of the charged battery 2 is typically of the order of 400 V. The battery 2 applies a voltage +Vbat to a first terminal, and a voltage −Vbat to a second terminal. The accumulators 21 are connected in series by way of electrical power connections. The terminals of the battery 2 are connected to a DC interface of an inverter 6. An electric motor 7 is connected to an AC interface of the inverter 6.

The connection between the terminals of the battery 2 and the DC interface of the inverter 6 is effected by way of a protection circuit 3 and by way of a power coupling circuit 5. The protection circuit 3 can comprises fuses configured to open the connection during a short-circuit. The power coupling circuit 5 comprises breakers 51 and 52 making it possible to selectively connect and disconnect the terminals of the battery 2 to or from the DC interface of the inverter 6. The opening and closing of the breakers 51 and 52 is controlled by a control circuit 8, which is typically a computer for supervising the operation of the battery 2. The control circuit 8 is typically powered by way of a battery 91, for supplying the onboard network of the vehicle 1, that has a much lower voltage level than that of the battery 2. The control circuit 8 is typically connected to the mechanical mass 93, including the metal chassis and bodyshell 92 of the vehicle 1.

Figure 2:
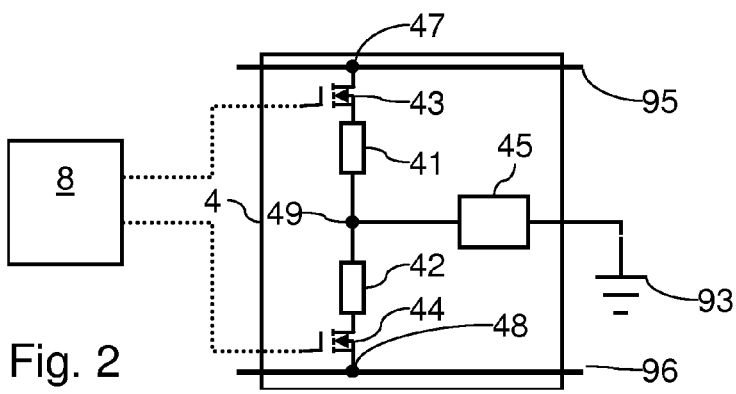
FIG. 2 is a schematic representation of an insulation defect detection device.

A device for detecting an insulation defect 4 is connected to the terminals of the battery 2 and to the mechanical mass 93. An embodiment of such a detection device 4 is detailed schematically in FIG. 2. The detection device 4 comprises input terminals 47 and 48 to which the voltages +Vbat and −Vbat are respectively applied by way of the power connections 95 and 96. The detection device 4 comprises a first impedance 41 and a second impedance 42 (in this instance resistors) connected in series between the first terminal 47 and the second terminal 48. The impedances 41 and 42 are connected by way of an intermediate point 49 and are preferably of substantially identical values. A first breaker 43 is connected in series with the first impedance 41 between the terminal 47 and the intermediate point 49. A second breaker 44 is connected in series with the second impedance 42 between the second terminal 48 and the intermediate point 49. The breakers 43 and 44 are, in this instance, MOSFET transistors. Other types of controlled breakers can, of course, be used. The control circuit 8 controls the respective opening/closing of the breakers 43 and 44. The detection device 4 furthermore comprises a connection with the mechanical mass 93. The detection device 4 comprises an insulation-defect-current detection circuit 45, connected between an intermediate point 49 and the mechanical mass 93. The detection circuit 45 is configured to receive a possible insulation defect current passing through the first or the second impedance when the breaker in series with one of the latter is closed.

As illustrated in FIG. 3, to test the insulation between the +Vbat terminal of the battery 2 and the mechanical mass 93, the control circuit 8 opens the breaker 43 and closes the breaker 44. However, it would also be possible to test the insulation between the terminals of the battery 2 and the mechanical mass 93 by simultaneously closing the breakers 43 and 44. The current-detection circuit 45 is then connected in series with the impedance 42 between the −Vbat terminal and the mechanical mass 93. In the case of insulation defect on the +Vbat side, a circuit forms by way of the insulation defect between the +Vbat terminal and ground 93 and a current then passes through the detection circuit 45.

As illustrated in FIG. 4, to test the insulation between the −Vbat terminal of the battery 2 and the mechanical mass 93, the control circuit 8 opens the breaker 44 and closes the breaker 43. The current-detection circuit 45 is then connected in series with the impedance 41 between the +Vbat terminal and the mechanical mass 93. In the case of an insulation defect on the −Vbat side, a circuit forms by way of the insulation defect between the −Vbat terminal and ground 93 and a current then passes through the detection circuit 45.

By using the breakers 43 and 44, the electrical consumption of the detection device 4 can be restricted because the duty ratio of closing of the breakers 43 and 44 can be restricted. The detection device 4 therefore only marginally affects the autonomy of the battery 2. It is for example possible to close each breaker 43 and 44 at a time interval of between 2 and 30 seconds, for example every 10 seconds, during the operation of the vehicle 1. The speed of switching of the transistors 43 and 44 will be sufficiently restricted to limit the generation of electromagnetic disturbances in the electrical circuit of the vehicle 1. With a very restricted duty ratio of closing of the breakers 43 and 44, it is possible to use relatively restricted values for the impedances 41 and 42, thereby making it possible to increase the sensitivity of the detection device 4 without appreciably impairing the autonomy of the battery 2. When the mechanical mass 93 is accessible to the users, (for example the body shell of the vehicle 1), the maximum current passing through this mechanical mass upon the appearance of a first insulation defect must be less than a maximum insulation defect current Imax defined by a standardized safety threshold. The insulation defect current will, for example, be defined to be less than 3.5 mA (which is a value of Imax detailed in the document NF EN61851-21, page 8—chapter 8.2). For this purpose the impedances 41 and 42 will each exhibit an impedance value at least equal to Zmin, with Zmin=Vm/Imax, and VM the nominal voltage applied by the battery 2 between the terminals 47 and 48. Generally, resistors 41 and 42 exhibiting a resistance value of greater than 100 kΩ will be used. The resistors 41 and 42 can also be used as protection against over-voltages originating from the network allowing the protection of the transistors 43 and 44 for the use of a non-insulated exterior charger ensuring the recharging of the battery 2. The resistors 41 and 42 also ensure attenuation of the amplitude of the current through the detection circuit 45.

In order to retain a sufficiently low insulation defect detection threshold, the impedances 41 and 42 each exhibit an impedance value Z at the most equal to Zmax, with Zmax=1.5*Vm/Imax.

Advantageously, the resistors 41 and 42 are formed of several resistors in series, so that if one of the resistors in series is short-circuited, the remaining resistors in series protect the detection device 4 against a short-circuit.

Advantageously, the resistors 41 and 42 have an open-circuit failure mode, and are, for example, embodied in the form of coiled resistors. Upon failure of one of the resistors 41 or 42, the detection device 4 is protected against a short-circuit.

FIG. 5 illustrates a first embodiment of the detection circuit 45 that make, it possible to determine the amplitude of the insulation defect current, and thus to analyze its evolution over time. The detection circuit 45 includes a microcontroller 453. The microcontroller 453 is connected to the input 491 and to the mechanical mass 93, and is supplied by the potential Vcc. The voltage Vcc can be derived from the battery 91. This voltage may, for example, be 3.3 V, which corresponds to a common power supply level for electronic circuits. A resistor 456 is connected between Vcc and the input 491. A diode 454 is advantageously connected in parallel with the resistor 456. A resistor 457 is connected between Vcc and the input 491. A diode 455 is advantageously connected in parallel with the resistor 457. The potential difference Vcc applied to the terminals of the resistors 456 and 457 in series is at least ten times lower than the voltage level of the DC source (the nominal voltage level for the battery 2), so as to guarantee safety of users in contact with ground 93, and so as to permit use of low-voltage hardware components to make the circuit 45.

The resistors 456 and 457 are of the same values. With no insulation defect current. The voltage on the input 491 is at the value Vcc/2.

Any insulation defect current, whatever its direction, modifies the voltage on the input 491. In the case of an insulation defect with the terminal 47, the voltage read on the input 491 of the microcontroller 453 is increased with respect to Vcc/2, with an amplitude that may reach a value of R/2*Idef (with R the value of the resistor 456 or 457 and Idef the defect current originating from the intermediate point 49). In the case of an insulation defect with the terminal 48, the voltage read on the input 491 of the microcontroller 453 is restricted with respect to Vcc/2, with an amplitude that may reach a value of R/2*Idef.

As a function of the voltage value read on the input 491, the microcontroller 453 can precisely determine the amplitude of the insulation defect. This result is obtained by means of a particularly simple circuit, not requiring the use of power supplies having opposite potentials. The voltage value read on the input 491 can be provided to the control circuit 8. The microcontroller 453 can, for example, generate a signal of amplitude proportional to the voltage on the input 491 and provide this signal to the control circuit 8.

Advantageously, the voltage Vcc is connected to the input 491 by way of the resistor 456 and applied as a supply voltage for the microcontroller 453. A single power supply is thus necessary and can readily be derived from the voltage of the battery 91. An onboard network battery typically exhibits a nominal voltage of less than 14 V for a private vehicle and a nominal voltage of less than 25 V for a bus or a truck.

The diodes 454 and 455 advantageously make it possible to protect the microcontroller 453 against over-voltages originating from the electrical network, in particular when using a non-insulated charger. Indeed, if a significant voltage appears in common mode or in differential mode across the terminals of the battery 2, this voltage contributes to making a significant current flow in the resistors 456 or 457, at the risk of an over-voltage on the input 491. The diodes 454 and 455 thus make it possible to limit the voltage on the input 491 between values −Vd and Vcc+Vd (with Vd being the threshold voltage of the diodes 456 and 457). The diodes 454 and 455 also make it possible to obtain both good sensitivity of measurements and restricted electrical consumption. With resistors 456 and 457 of low amplitude, the diodes 454 and 455 will make it possible to clip the significant insulation-defect currents, or to obtain good sensitivity for weaker currents.

In practice, ground 93 is not placed at the potential of the intermediate point 49, but at a potential shifted by a value of Vcc/2. With the envisaged values of Vcc (typically less than 25 V), this shift in potential of the ground 93 induces neither operating problems nor safety problems.

Figure 6:
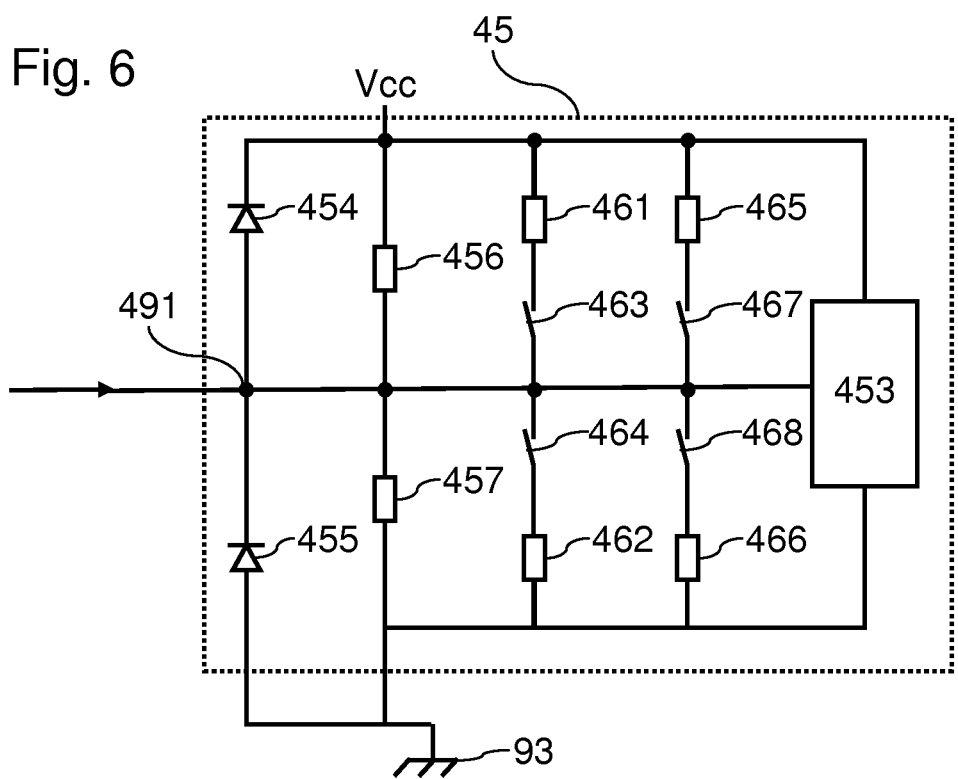
FIG. 6 is a schematic representation of a leakage current quantification circuit of a second embodiment.

FIG. 6 illustrates a second embodiment of the detection circuit 45 that makes it possible to modify the sensitivity as a function of the amplitude of the leakage current. The detection circuit of this embodiment is substantially identical to that of FIG. 5 and differs solely in the presence of switchable resistors connected in parallel with the resistors 456 and 457.

The circuit 45 thus comprises a resistor 461 and a breaker 463 connected in parallel with the resistor 456, a resistor 465 and a breaker 467 connected in parallel with the resistor 456, a resistor 462 and a breaker 464 connected in parallel with the resistor 457, a resistor 466 and a breaker 468 connected in parallel with the resistor 457.

The amplitude of the resistor 461 is less than the amplitude of the resistor 456. Likewise, the amplitude of the resistor 465 is less than the amplitude of the resistor 461. The amplitude of the resistor 462 is less than the amplitude of the resistor 457. Likewise, the amplitude of the resistor 466 is less than the amplitude of the resistor 462.

In the absence of any insulation-defect current detected by the microcontroller 453, the control circuit 8 keeps the breakers 463, 464, 467 and 468 open. The microcontroller 453 or the control circuit 8 determines the presence of an insulation defect when the voltage measured on the input 491 is shifted beyond a first predetermined threshold. When this first shift threshold is crossed, the control circuit 8 undertakes the closing of the breakers 463 and 464 so as to increase the measurement sensitivity of the microcontroller 453. The closing of the breakers 463 and 464 is both transient so as to limit electrical consumption, and simultaneous. When the voltage measured on the input 491 is shifted beyond a second predetermined threshold, the control circuit 8 undertakes the closing of the breakers 467 and 468 so as to further increase the measurement sensitivity of the microcontroller 453. The closing of the breakers 467 and 468 is both transient so as to limit electrical consumption, and simultaneous.

In order for the voltage on the input 491 to remain between the ground voltage and Vcc in the case of short-circuit between the ground 93 and one of the terminals of the battery 2, the impedances 456 and 457 each exhibit an impedance of at most Ztmax, with Ztmax=Z*Vcc/2 Vm. In order for the voltage on the input 491 to remain sufficient to guarantee optimal precision of the quantification of the insulation defect, the impedances 456 and 457 each exhibit an impedance of at least Ztmin, with Ztmin=Z*Vcc/4 Vm.

In AC electrical installations, the commonest neutral regimes are: the EE regime, in which the neutral of the installation is grounded on the generator side and the metallic masses are grounded; the EN regime, in which the neutral of the installation is grounded on the generator side and the metallic masses are linked to the neutral; and the IE regime, in which the neutral of the installation is insulated from the ground or linked by a high impedance on the generator side and the metallic masses are linked to a ground outlet.

The neutral regime thus defines the way in which the neutral is linked up and the way in which the masses are linked up on the user side. The aim of the grounding layouts is to protect people and hardware by overseeing the insulation defects.

The grounding layout for the battery 2 can be regarded as an IE neutral regime of an electrical network, that is to say, a neutral insulated with respect to ground and a mechanical mass linked up to ground (except while driving where the mechanical mass is insulated from ground by way of the tires). Such a grounding layout makes it possible to ensure continuity of service of the vehicle upon the appearance of a first insulation defect. The user can thus continue to control the vehicle so as to stop it under good safety conditions.

To ensure the recharging of the battery 2 by an electrical network, an AC insulated charger connected to the network is generally linked up. In this case the IE regime is retained. On the other hand, a galvanically insulated charger is more expensive than a non-insulated charger. With a non-insulated charger, the EE regime exists during charging. This amounts to connecting the ground to the potential −Vbat of the battery 2 during the positive alternations of the electrical network. A current then travels through the ground during these alternations.

Having described the invention, and a preferred embodiment thereof, what is claimed as new, and secured by Letters Patent is:

1. An apparatus comprising an electrical power supply device, said electrical power supply comprising a DC voltage source capable of providing a voltage sufficient to induce electrocution, said DC voltage source being configured to apply a nominal voltage $V_m$ between terminals thereof, and a device for detecting an insulation defect of said DC voltage source, wherein said device comprises first and second input terminals connected to said terminals of said voltage source, first and second impedances connected in series between said first and second input terminals, said first and second impedances each having an impedance value Z of between $Z_{min}$ and $Z_{max}$, wherein $Z_{min}=V_m/I_{max}$ and $Z_{max}=1.5*V_m/I_{max}$, wherein Imax is a maximum insulation defect current defined by a standardized safety threshold, and a current-detection circuit connected between an electrical ground and an intermediate point between said first and second impedances, wherein said current-detection circuit further comprises a microcontroller comprising an input terminal configured to receive a voltage proportional to said insulation defect current originating from said intermediate point, said input terminal being connected by a third impedance to a power supply with a voltage level $V_{cc}$ at least ten times lower than said voltage level of said DC voltage source, said input terminal being connected to said electrical ground by way of a fourth impedance, said microcontroller being configured to determine an amplitude of said maximum insulation defect current as a function of said voltage applied to said input terminal, wherein said third and fourth impedances each have an impedance value $Z_t$ of between $Z_{tmin}$ and $Z_{tmax}$, wherein $Z_{tmin}=Z*V_{cc}/(4*V_m)$ and $Z_{tmax}=Z*V_{cc}/2 V_m$.

2. The apparatus of claim 1, wherein said first and second impedances are selected so as to be traversed by a maximum current of less than 3.5 mA when one of said terminals of said DC voltage source is short-circuited to said electrical ground.

3. The apparatus of claim 1, further comprising a first breaker connected in series with said first impedance between said first input terminal and said intermediate point, a second breaker connected in series with said second impedance between said second input terminal and said intermediate point, and a control circuit configured to simultaneously keep one of said first and second breakers open and an other of said first and second breakers closed.

4. The apparatus of claim 1, further comprising a first diode connected in parallel with said third impedance and a second diode connected in parallel with said fourth impedance.

5. The apparatus of claim 1, wherein said third and fourth impedances are substantially identical resistors.

6. The apparatus of claim 1, further comprising a fifth impedance connected in parallel with said third impedance and having a lower impedance value than said third impedance, a sixth impedance connected in parallel with said fourth impedance and having a lower impedance value than said fourth impedance, a first breaker connected in series with said fifth impedance, and, a second breaker connected in series with said sixth impedance.

7. The apparatus of claim 6, further comprising a control circuit configured to transiently and simultaneously close said first and second breakers.

8. The apparatus of claim 7, wherein said control circuit is configured to determine that said amplitude of said maximum insulation defect current exceeds a threshold and to transiently close said first and second breakers when a crossing of said threshold is determined.

9. The apparatus of claim 7, wherein said microcontroller is configured to generate a signal proportional to said voltage of said intermediate point and to provide said control circuit with said generated signal.

10. The apparatus of claim 1, wherein said voltage level of said power supply is less than 25 V.

11. The apparatus of claim 1, wherein said first and second impedances have an impedance value of greater than or equal to 100 kΩ.

12. The apparatus of claim 1, wherein said first and second impedances are substantially identical resistors.

13. The apparatus of claim 1, wherein said DC voltage source comprises a battery having terminals, said apparatus further comprising an inverter comprising a DC interface and an AC interface, wherein said terminals of said battery are connected to said DC interface, and wherein an electric motor is connected to said AC interface.

14. The apparatus claim 13, wherein a voltage across said terminals of said battery is greater than 100 V.

\* \* \* \* \*